(12) United States Patent
Seddon et al.

(10) Patent No.: US 9,337,098 B1
(45) Date of Patent: May 10, 2016

(54) SEMICONDUCTOR DIE BACK LAYER SEPARATION METHOD

(71) Applicant: SEMICONDUCTOR COMPONENTS INDUSTRIES, LLC, Phoenix, AZ (US)

(72) Inventors: Michael Seddon, Gilbert, AZ (US); William Burghout, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/827,110

(22) Filed: Aug. 14, 2015

(51) Int. Cl.
| H01L 21/78 | (2006.01) |
| H01L 21/82 | (2006.01) |
| H01L 21/683 | (2006.01) |
| H01L 21/687 | (2006.01) |
| H01L 21/67 | (2006.01) |

(52) U.S. Cl.
CPC ............ H01L 21/82 (2013.01); H01L 21/6708 (2013.01); H01L 21/6836 (2013.01); H01L 21/68764 (2013.01); H01L 21/78 (2013.01); H01L 2221/68327 (2013.01)

(58) Field of Classification Search
CPC ..................... H01L 21/02296; H01L 21/4814; H01L 21/7806; H01L 21/784
See application file for complete search history.

(56) References Cited

U.S. PATENT DOCUMENTS

| 5,401,690 | A | 3/1995 | Chen |
| 5,919,713 | A | 7/1999 | Ishii et al. |
| 6,406,979 | B2 | 6/2002 | Fischer et al. |
| 7,781,310 | B2 | 8/2010 | Grivna |
| 7,985,661 | B2 | 7/2011 | Grivna |
| 7,989,319 | B2 | 8/2011 | Grivna et al. |
| 8,012,857 | B2 | 9/2011 | Grivna et al. |
| 2005/0196940 | A1 | 9/2005 | Yajima et al. |
| 2009/0061595 | A1 | 3/2009 | Weber et al. |
| 2009/0191690 | A1 | 7/2009 | Boyle et al. |
| 2011/0175242 | A1 | 7/2011 | Grivna et al. |
| 2011/0177675 | A1 | 7/2011 | Grivna et al. |
| 2011/0244657 | A1 | 10/2011 | Grivna et al. |
| 2014/0094018 | A1 | 4/2014 | Falvo et al. |

FOREIGN PATENT DOCUMENTS

| EP | 1873824 A1 | 1/2008 |
| WO | 2014052445 A1 | 4/2014 |

OTHER PUBLICATIONS

Search Report for counterpart EP Application No. 13181098.8, dated Nov. 3, 2014, 5 pages.

*Primary Examiner* — Cheung Lee
(74) *Attorney, Agent, or Firm* — Kevin B. Jackson

(57) ABSTRACT

In one embodiment, semiconductor die are singulated from a semiconductor wafer having a backmetal layer by placing the semiconductor wafer onto a carrier tape with the backmetal layer adjacent the carrier tape, forming singulation lines through the semiconductor wafer to expose the backmetal layer within the singulation lines, and separating portions of the backmetal layer using a fluid.

24 Claims, 14 Drawing Sheets

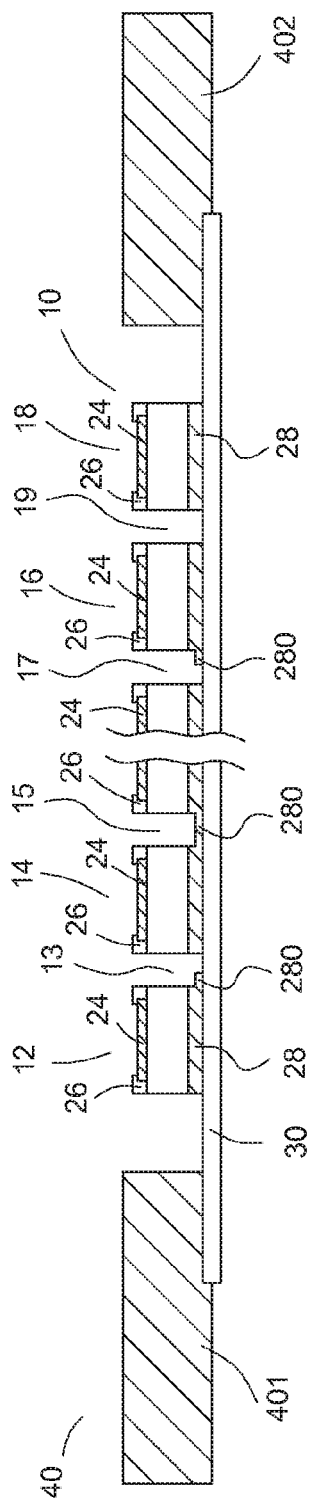
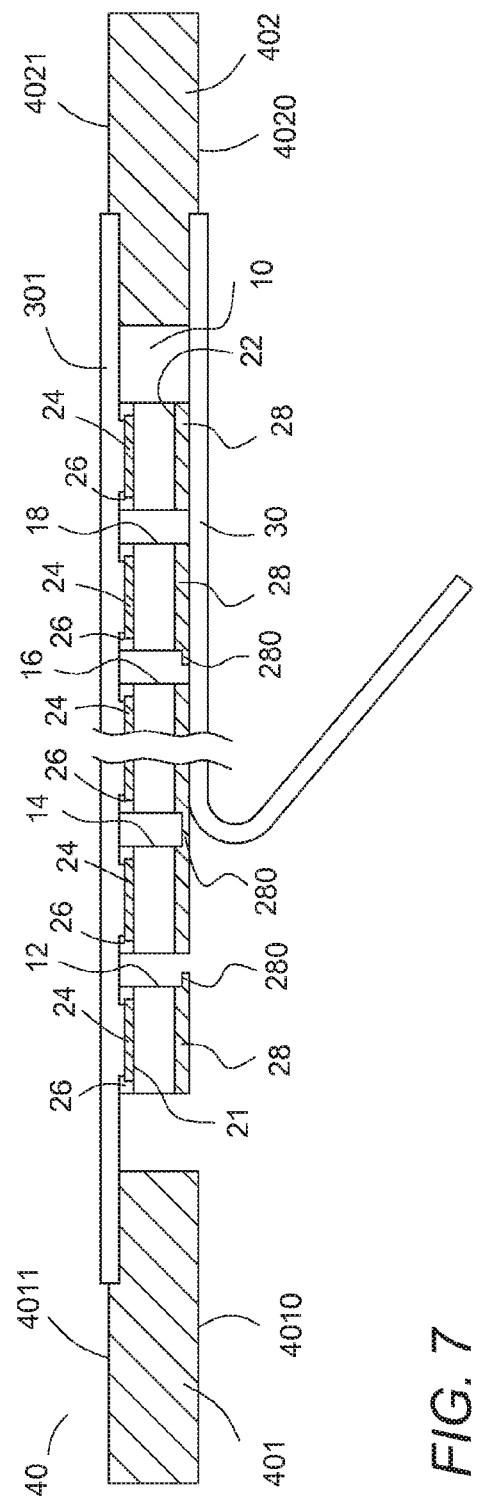
FIG. 6
FIG. 7

SEMICONDUCTOR DIE BACK LAYER SEPARATION METHOD

CROSS REFERENCE TO RELATED APPLICATIONS

Not applicable.

BACKGROUND

The present invention relates, in general, to electronics and, more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), stealth dicing (laser dicing from the backside of the wafer), and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as backmetal layers, because the etch process has been unable to effectively remove the backside layers from the singulation lines. Removing the backside layers from the scribe lines is necessary to facilitate subsequent processing, such as pick-and-place and assembly processes.

Accordingly, it is desirable to have a method of singulating die from a semiconductor wafer that separates the backside layers from within the singulation lines. It would be beneficial for the method to be cost effective, to minimize any damage to or contamination of the separated die and to support reclaim efforts.

BRIEF DESCRIPTION OF THE DRAWINGS

FIGS. 2-10 illustrate partial cross-sectional views of an embodiment of a the semiconductor wafer of FIG. 1 at various stages in a process of singulating die from the wafer in accordance with an embodiment of the present invention;

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Figure 1:
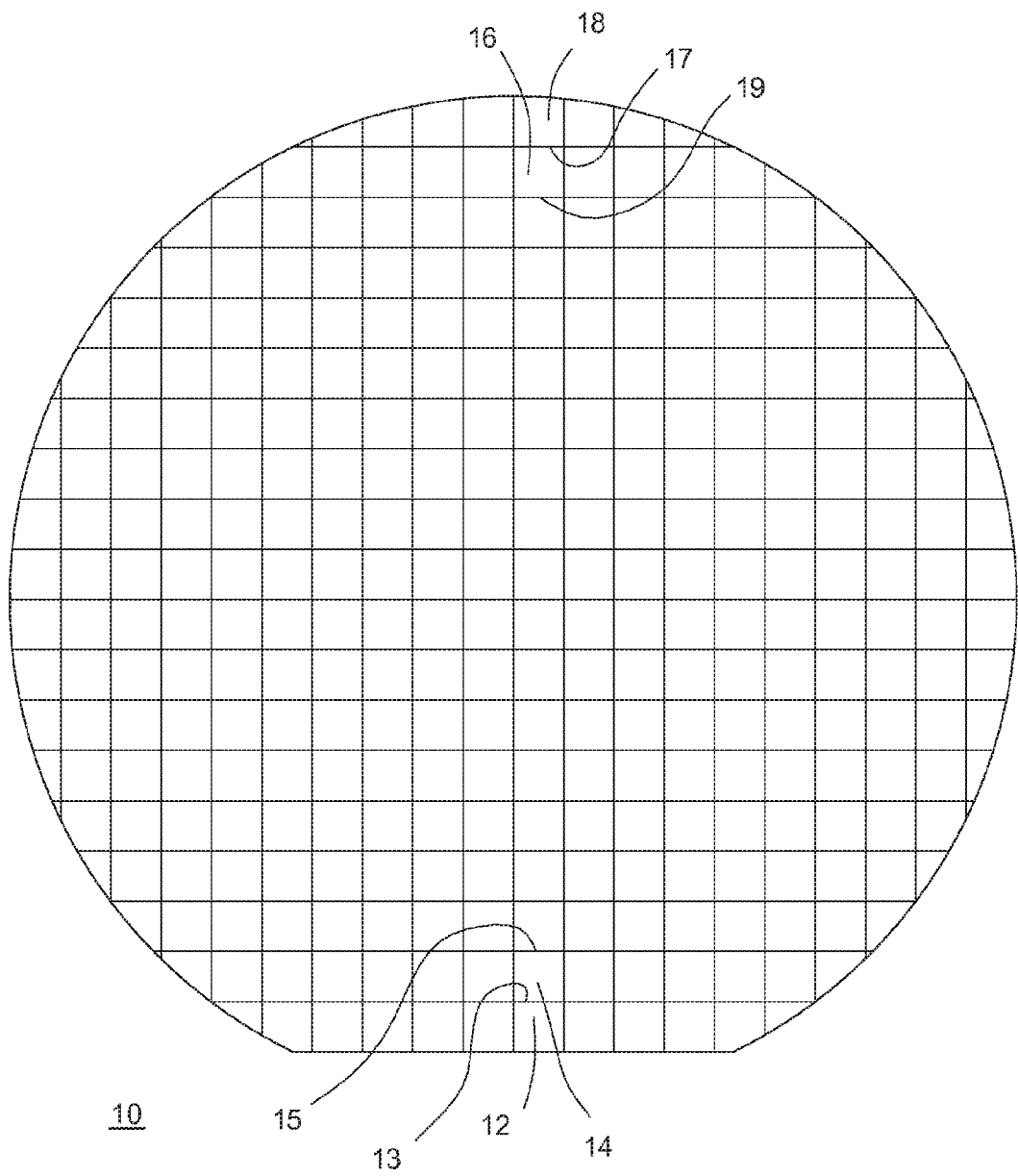
FIG. 1 illustrates a reduced plan view of an embodiment of a semiconductor wafer in accordance with the present invention.

FIG. 1 is a reduced plan view that graphically illustrates a semiconductor wafer 10 at a later step in fabrication. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. As is well known in the art, all of the semiconductor die on wafer 10 generally are separated from each other on all sides by areas where scribe lines or singulation lines, such as singulation lines 13, 15, 17, and 19 are to be formed. Die 12, 14, 16, and 18 can be any kind of electronic device including semiconductor devices such as, diodes, transistors, discrete devices, sensor devices, optical devices, integrated circuits or other devices known to one of ordinary skill in the art. In one embodiment, wafer 10 has completed wafer processing including the formation of a backside layer described hereinafter.

Figure 2:
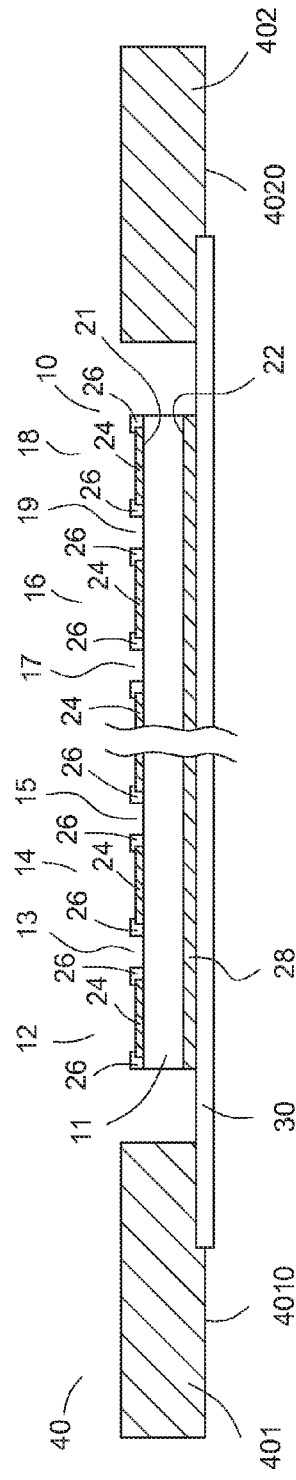

FIG. 2 illustrates an enlarged cross-sectional view of wafer 10 at an early step in a die singulation method in accordance with a first embodiment. In one embodiment, wafer 10 is attached to a carrier substrate, transfer tape, or carrier tape 30 that facilitates supporting the plurality of die after they are singulated. Such carrier tapes are well known to those of skill in the art. In one embodiment, carrier tape 30 can be attached to a frame 40, which can include frame portions or portions 401 and 402. As illustrated, carrier tape 30 can be attached to surface 4010 of frame portion 401 and to surface 4020 of frame portion 402.

In the cross-section illustrated, wafer 10 can include a bulk substrate 11, such as a silicon substrate, which can include opposing major surfaces 21 and 22. In one embodiment, contact pads 24 can be formed along portions of major surface 21 to provide for electrical contact between structures formed within substrate 11 and next levels of assembly or external elements. For example, contact pads 24 can be formed to receive bonding wires or clips that may be subsequently attached to contact pads 24, or contact pads 24 can be formed to receive a solder ball, bump or other type of attachment structure. Contact pads 24 generally can be a metal or other conductive material. Typically, a dielectric material 26, such as a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, or polyimide when substrate 11 is silicon.

In one embodiment, openings can be formed in dielectric material 26 (and other dielectric layers that can be formed underneath dielectric material 26) to expose underlying surfaces of contact pads 24 and surfaces of substrate 11 where singulation lines 13, 15, 17, and 19 are to be formed. As illustrated and in accordance with the present embodiment, wafer 10 further includes a layer of material 28 formed on or overlying major surface 22 of wafer 10. In one embodiment, layer 28 can be a conductive backmetal layer. In one embodiment, layer 28 can be a multi-layer metal system such as, titanium/nickel/silver, titanium/nickel/silver/tungsten, chrome/nickel/gold, copper, copper alloys, gold, or other materials known to those skilled in the art. In another embodiment, layer 28 can be a wafer backside coating (WBC) film, such as a die-attach coating.

Figure 3:
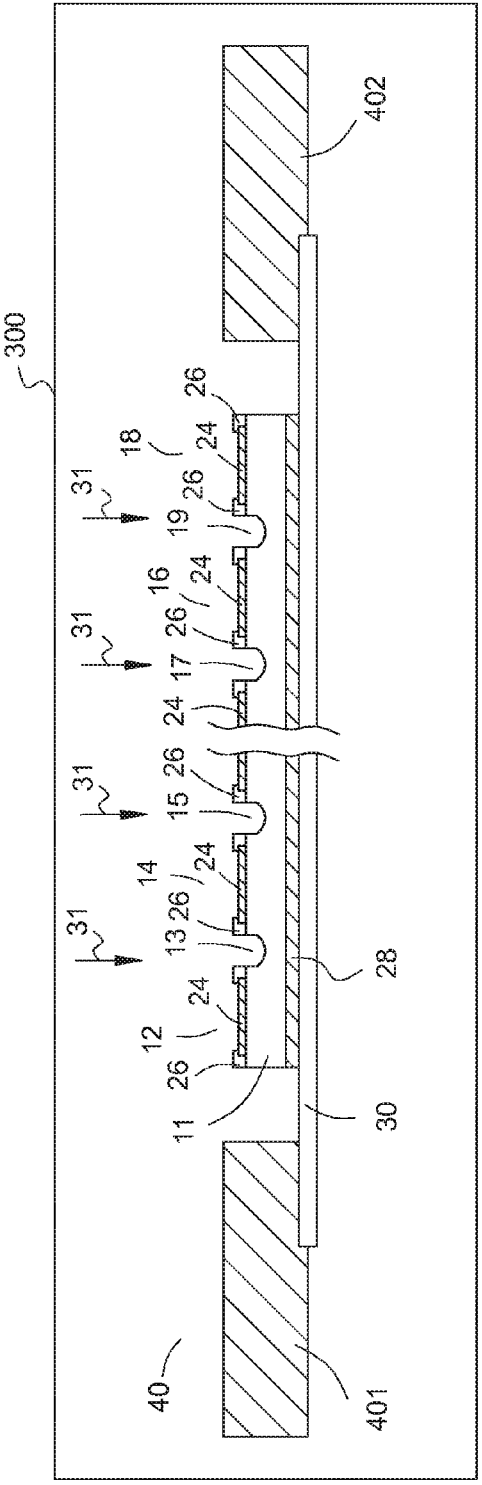
Figure 4:
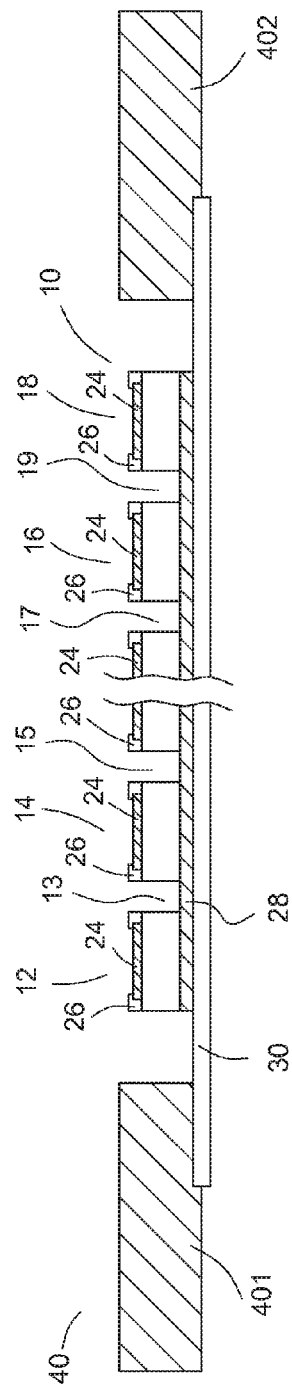

FIG. 3 illustrates an enlarged cross-sectional view of wafer 10 at a subsequent step during a plasma etch singulation process. In one embodiment, wafer 10 can be mounted on carrier tape 30 and then can be placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon at a much higher rate than that of dielectrics and/or metals. In one embodiment, wafer 10 can be etched using a process commonly referred to as the Bosch process. In one embodiment, wafer 10 can be etched using the Bosch process in a Plasma-Therm Singulator™ plasma dicing system available from Plasma-Therm of St. Petersburg, Fla., U.S.A. In one embodiment, the width of singulation lines 13, 15, 17, and 19 can be from about five microns to about fifteen microns. Such a width is sufficient to ensure that the openings that form singulation lines 13, 15, 17, and 19 can be formed completely through substrate 11 stopping proximate to layer 28 because of the etch selectivity as generally illustrated in FIG. 4. In one embodiment, layer 28 can be used as a stop layer for the plasma etch singulation process. In one embodiment, singulation lines 13, 15, 17, and 19 can be formed in about fifteen to about thirty minutes using the Bosch process.

Figure 5:
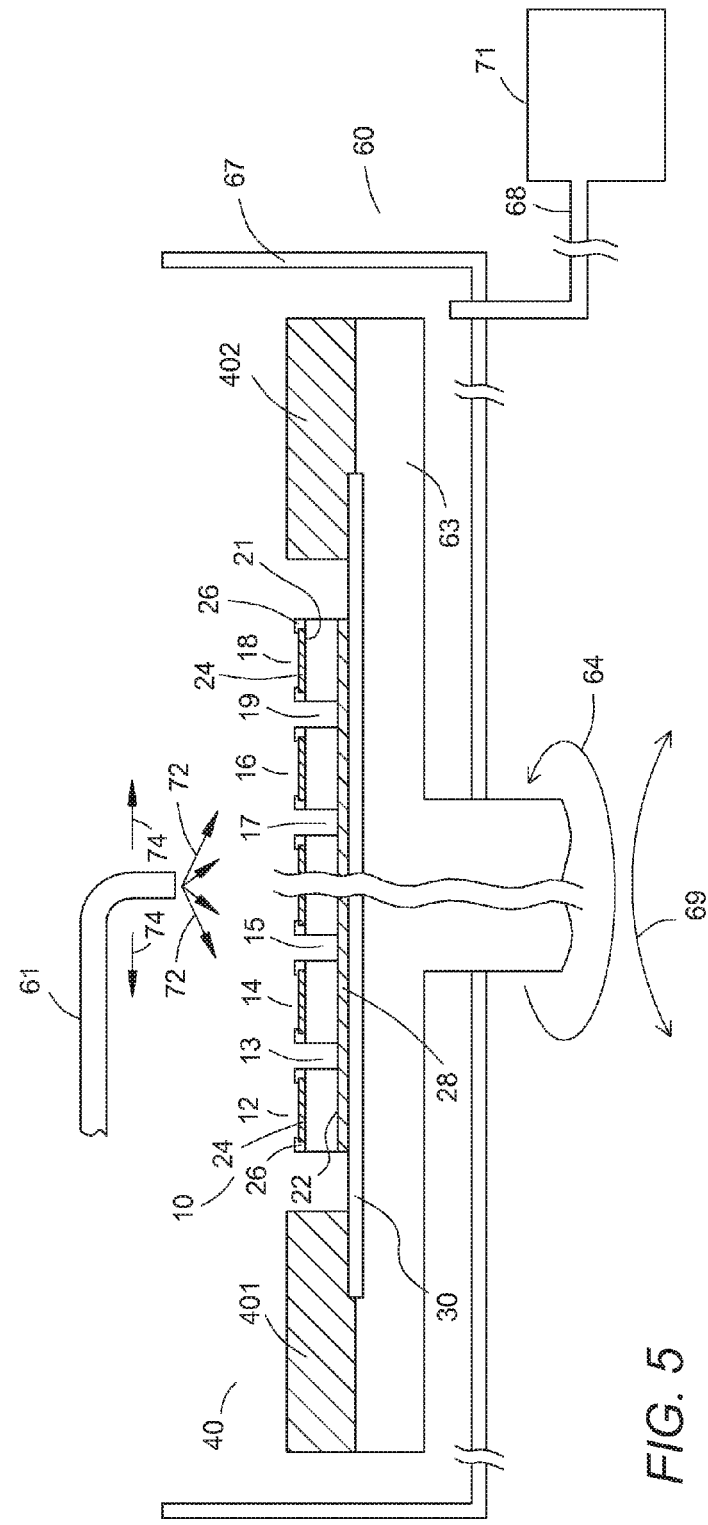

FIG. 5 illustrates a cross-sectional view of wafer 10 at a subsequent process step. In one embodiment, a pressurized fluid removal step, a fluid ablation step, or a fluid machining step is used to remove portions of layer 28 from within singulation lines 13, 15, 17, and 19 in accordance with the present embodiment. In one embodiment, frame 40 including wafer 10 on carrier tape 30 can be placed in a fluid spin rinse apparatus 60. In one embodiment, major surface 21 of wafer 10 can be facing upward or away from carrier tape 30. In one embodiment, apparatus 60 can be configured with a nozzle or dispense fixture 61 placed above wafer 10 as illustrated in FIG. 5. Frame 40 and carrier tape 30 can be placed on a support structure 63 such as, a vacuum chuck. In one embodiment, structure 63 can be configured to spin or rotate as generally represented by arrow 64. In one embodiment, structure 63 can be configured stretch or expand carrier tape 30, as generally represented by arrow 69, to contribute additional forces to layer 28 to assist in its removal or separation from within the singulation lines.

Apparatus 60 can include a tub or basin structure 67, which can function to contain and to collect process effluent through outlet 68 into a collection tub 71. One benefit of the present method and apparatus is that material from layer 28 removed during the machining process can be saved for reclaim or for an environmentally appropriate disposal technique.

In one embodiment, layer 28 can be removed or machined using the process described above in a Disco brand spin-rinse apparatus. During the process, a machining medium, such as a fluid 72, can be dispensed from nozzle 61 while structure 63 and wafer 10 rotate. In one embodiment, nozzle 61 can move or swing across wafer 10 as generally represented by arrows 74. In one embodiment, fluid 72 can be liquids, gases, mixtures thereof, or another material that removes layer 28 while minimizing damage to or causing unwanted contamination of die 12, 14, 16, and 18. In one embodiment, fluid 72 can be water. In another embodiment, fluid 72 can be air or nitrogen. In one embodiment, a surfactant can be added to fluid 72, such as a Diamaflow™ surfactant manufactured by KETECA of Phoenix, Ariz., U.S.A. In one embodiment, an abrasive material can be added to fluid 72.

In one embodiment, the following process conditions can be used to remove layer 28. For example, fluid 72 can be de-ionized water at a pressure from about 10,342 kilopascal (kPa) to about 20,684 kPa (about 1500 pounds/square inch (psi) to about 3000 psi) as measured at the fluid pump. Wafer 10 can be spinning at a rate from about 700 rpm to 1500 rpm with fluid 72 flowing onto wafer 10 from about 2 minutes to about 5 minutes.

It is understood that the method described herein can also be used to remove other structures, such as alignment keys, test structures, and/or residual semiconductor material, from within singulation lines 13, 15, 17, and/or 19 that may not be removed during the plasma etch process. The steps described hereinafter can be used in one embodiment to removing remaining portions 280 from the singulation lines.

FIG. 6 illustrates a cross-sectional view of wafer 10 after portions of layer 28 within singulation lines 13, 15, 17, and 19 have been removed. As illustrated in this embodiment, portions 280 of layer 28 can remain after the fluid machining process described previously. Portions 280 can remain because singulation lines 13, 15, 17, and 19 are configured with narrower widths when singulation processes, such as plasma-singulation, are used instead of conventional dicing processes that require much wider singulation lines.

FIG. 7 illustrates a cross-sectional view of wafer 10 at a subsequent process step. In one embodiment, carrier tape 30 can be exposed to an ultra-violet (UV) light to source to reduce the adhesiveness of the tape. Subsequently, a carrier tape 301 can be applied or attached to conductive pads 24 along upper surfaces of wafer 10 (that is, overlying major surface 21 of wafer 10), surface 4011 of frame portion 401, and surface 4021 of frame portion 402. In one embodiment, carrier tape 301 and carrier tape 30 can be similar materials. In another embodiment, carrier tape 301 can be a different material or can have different characteristics, such as adhesive and/or stretch characteristics, compared to carrier tape 30. In accordance with the present embodiment, after carrier tape 301 is applied, carrier tape 30 can be removed from wafer 10 and frame 40 to expose layer 28 and portions 280.

Figure 8:
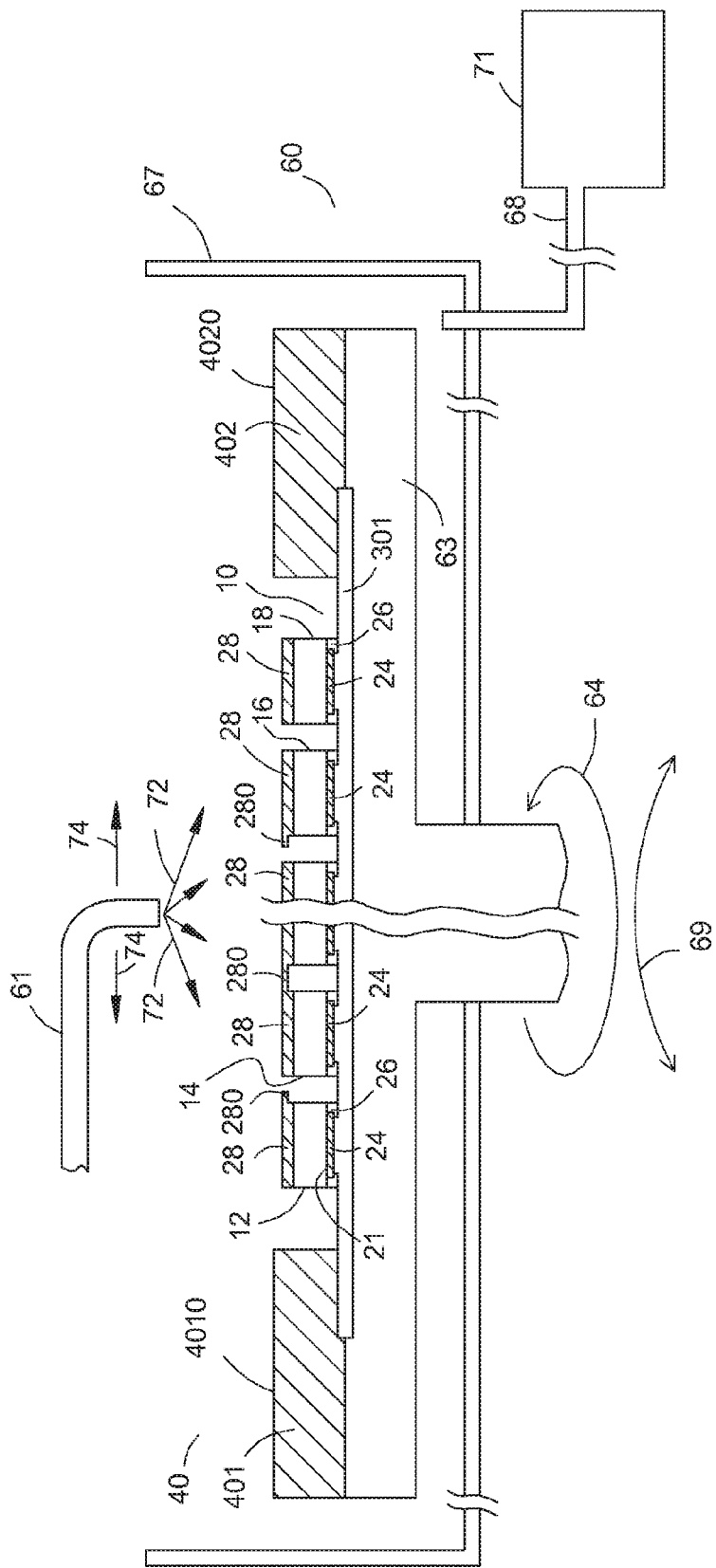
Figure 9:
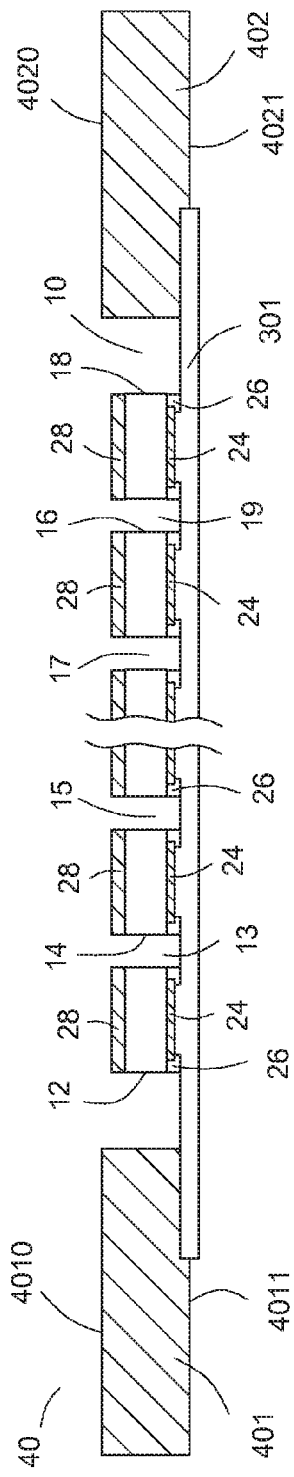

FIG. 8 illustrates a cross-sectional view of wafer 10 during subsequent processing. In one embodiment, wafer 10 is placed again within apparatus 60 with layer 28 facing upward (or towards nozzle 61), and portions 280 of layer 28 can be removed using the fluid machining process as described previously. For example, fluid 72 can be de-ionized water at a pressure from about 10,342 kPa to about 20,684 kPa (about 1500 psi to about 3000 psi) as measured at the fluid pump. Wafer 10 can be spinning at a rate from about 700 rpm to 1500 rpm with fluid 72 flowing onto wafer 10 from about 2 minutes to about 5 minutes. In one embodiment, after portions 280 of layer 28 have been removed, as well as any other unwanted materials from singulation lines 13, 15, 17, and/or 19, wafer 10 can be removed from apparatus 60 to provide the intermediate structure illustrated in FIG. 9.

Figure 10:
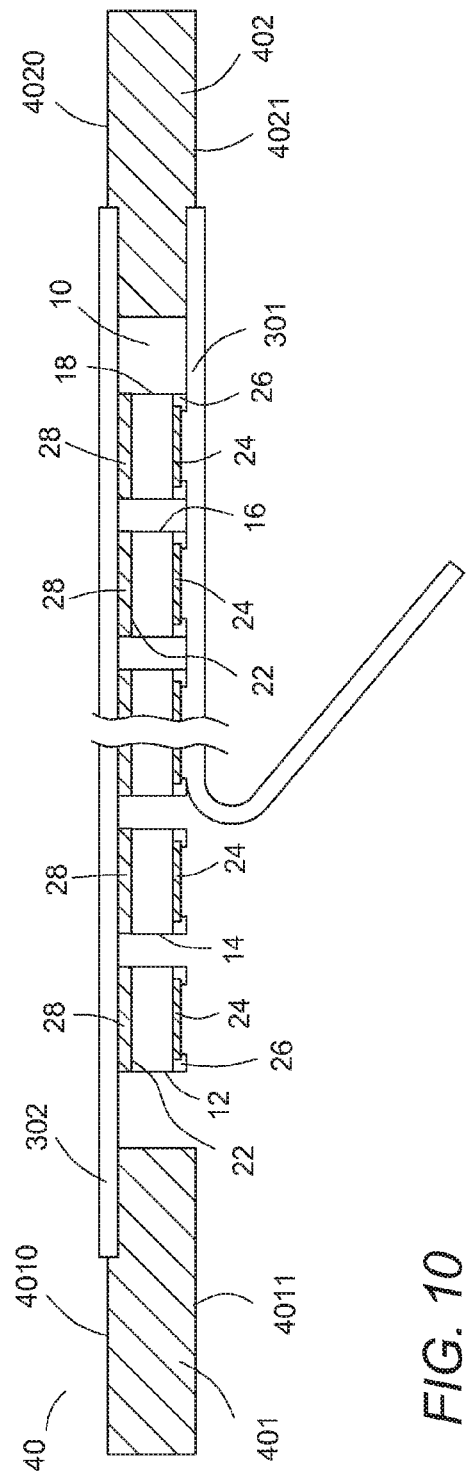
Figure 11:
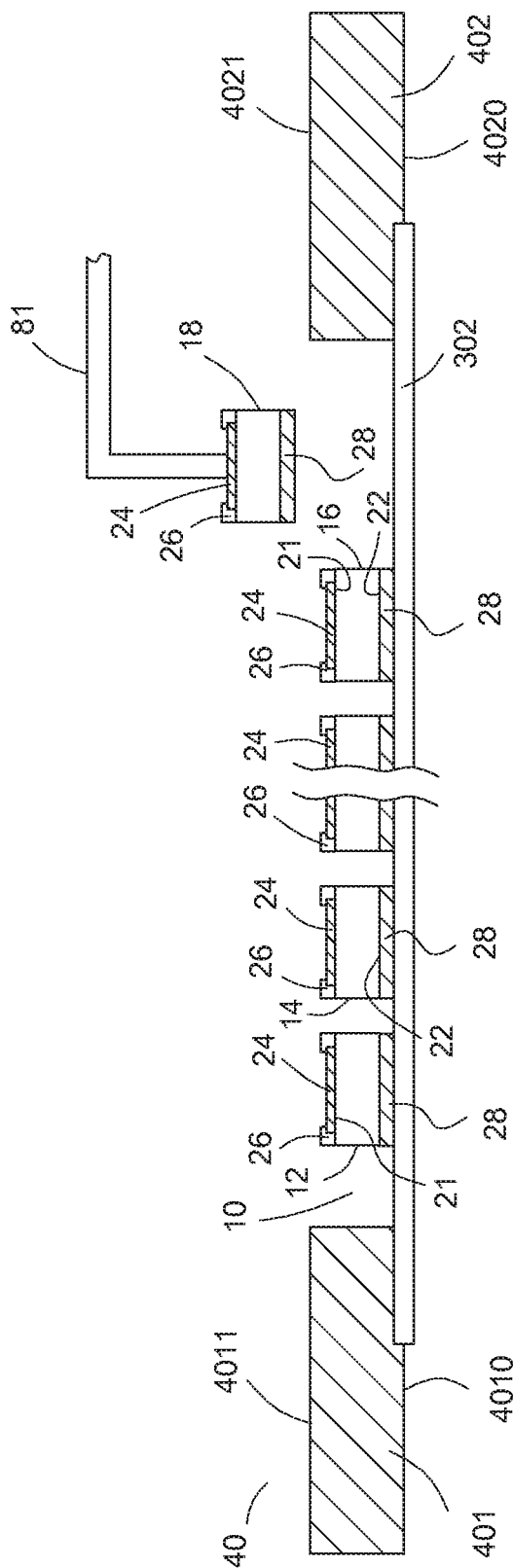
FIG. 11 illustrates a partial cross-sectional view of an embodiment of the semiconductor wafer of FIG. 10 or FIG. 15 at a later stage of processing in accordance with an embodiment of the present invention.

FIG. 10 illustrates a cross-sectional view of wafer 10 during subsequent processing. In one embodiment, carrier tape 301 can be exposed to a UV light source to reduce the adhesiveness of the tape. In one embodiment, a carrier tape 302 can be applied or attached to layer 28 of wafer 10, surface 4010 of frame portion 401, and surface 4020 of frame portion 402. In one embodiment, carrier tape 302, carrier tape 301, and carrier tape 30 can be similar materials. In another embodiment, carrier tape 302 can be a different material or can have different characteristics, such as adhesive and/or stretch characteristics, compared to carrier tape 30 and/or carrier tape 301. In accordance with the present embodiment, after carrier tape 302 is applied, carrier tape 301 can be removed from wafer 10 and frame 40 to expose conductive pads 24 overlying upper surface 21 of wafer 10. In a subsequent step, die 12, 14, 16, and 18 can be removed from carrier tape 302 as part of a further assembly process using, for example, a pick-and-place apparatus 81 as generally illustrated in FIG. 11. In one embodiment, carrier tape 302 can be exposed to a UV light source prior to the pick-and-place step to reduce the adhesiveness of the tape.

Figure 12:
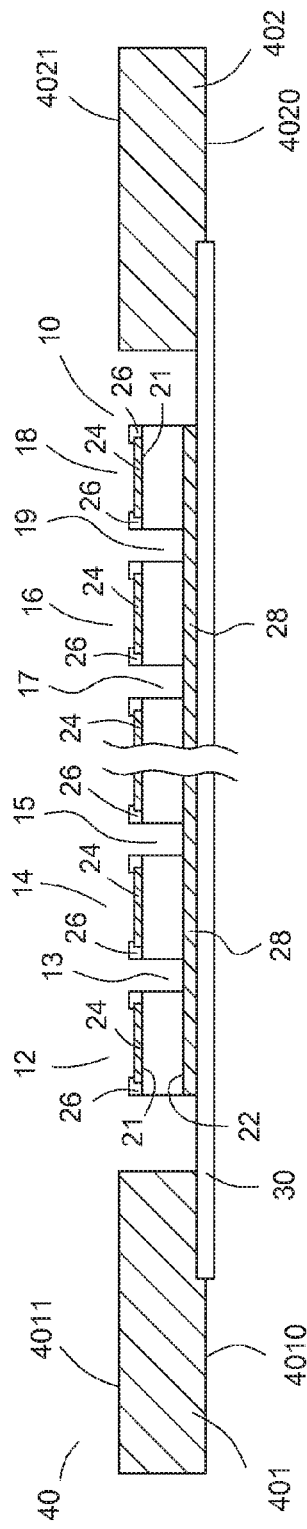
FIGS. 12-15 illustrate partial cross-sectional views of an embodiment of the semiconductor wafer of FIG. 1 at various stages of singulating die from the wafer in accordance with another embodiment of the present invention.
Figure 13:
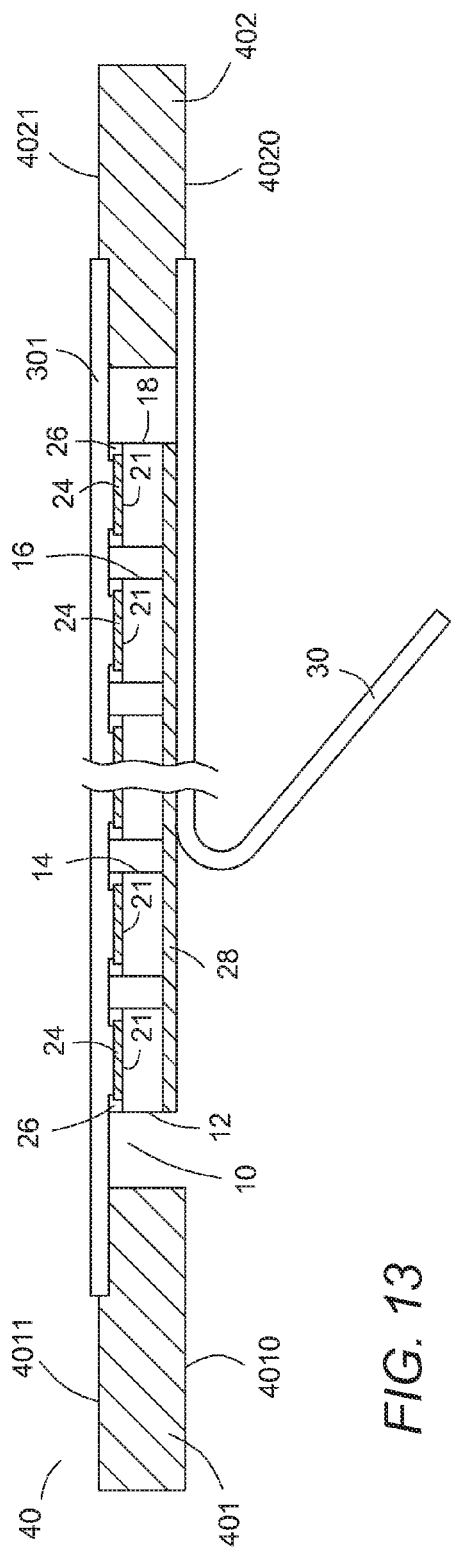

FIG. 12 illustrates a cross-sectional view of wafer 10 after a singulation process in accordance with an alternative embodiment. Wafer 10 can be attached to carrier tape 30, which is further attached to frame 40 as described previously in conjunction with FIG. 2. However, in this embodiment, carrier tape 301 can be applied or attached to contact pads 24 overlying upper surfaces of wafer 10 (that is, overlying major surface 21 of wafer 10), surface 4011 of frame portion 401, and surface 4021 of frame portion 402. In accordance with the present embodiment, after carrier tape 301 is applied, carrier tape 30 can be removed from layer 28, wafer 10, and frame 40 to expose layer 28 as illustrated in FIG. 13. In one embodiment, carrier tape 30 can be exposed to a UV light source to reduce the tackiness of the tape prior to the application of carrier tape 301.

Figure 14:
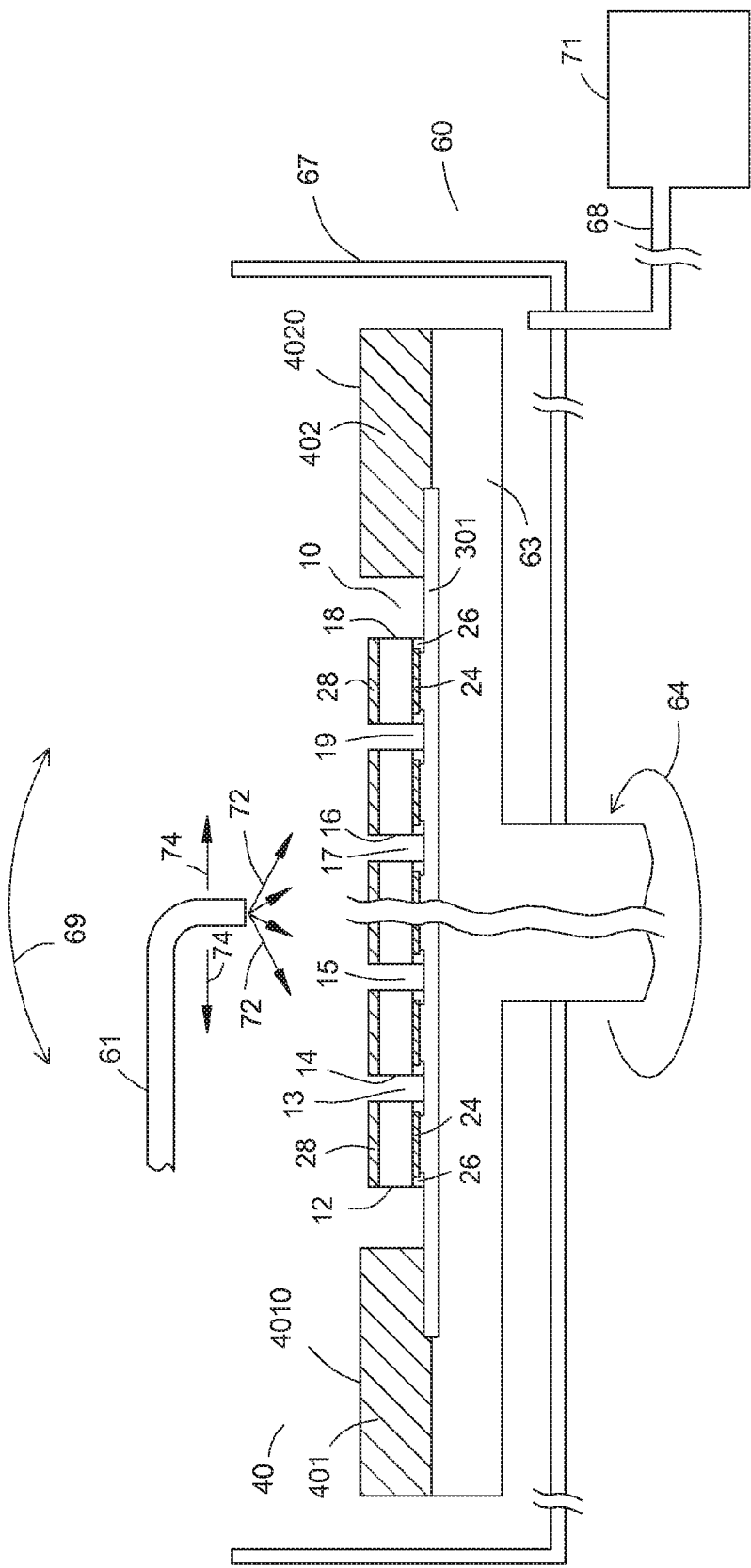

In a subsequent step, wafer 10 having layer 28 exposed or facing upward (or towards nozzle 61) is then placed within apparatus 60, and portions of layer 28 can be removed from singulation lines 13, 15, 17, and 19 as illustrated in FIG. 14. In one embodiment, the following process conditions can be used to remove portions of layer 28. For example, fluid 72 can be de-ionized water at a pressure from about 10,342 kPa to about 20,684 kPa (about 1500 psi to about 3000 psi) as measured at the fluid pump. Wafer 10 can be spinning at a rate from about 700 rpm to 1500 rpm with fluid 72 flowing onto wafer 10 from about 2 minutes to about 5 minutes.

Figure 15:
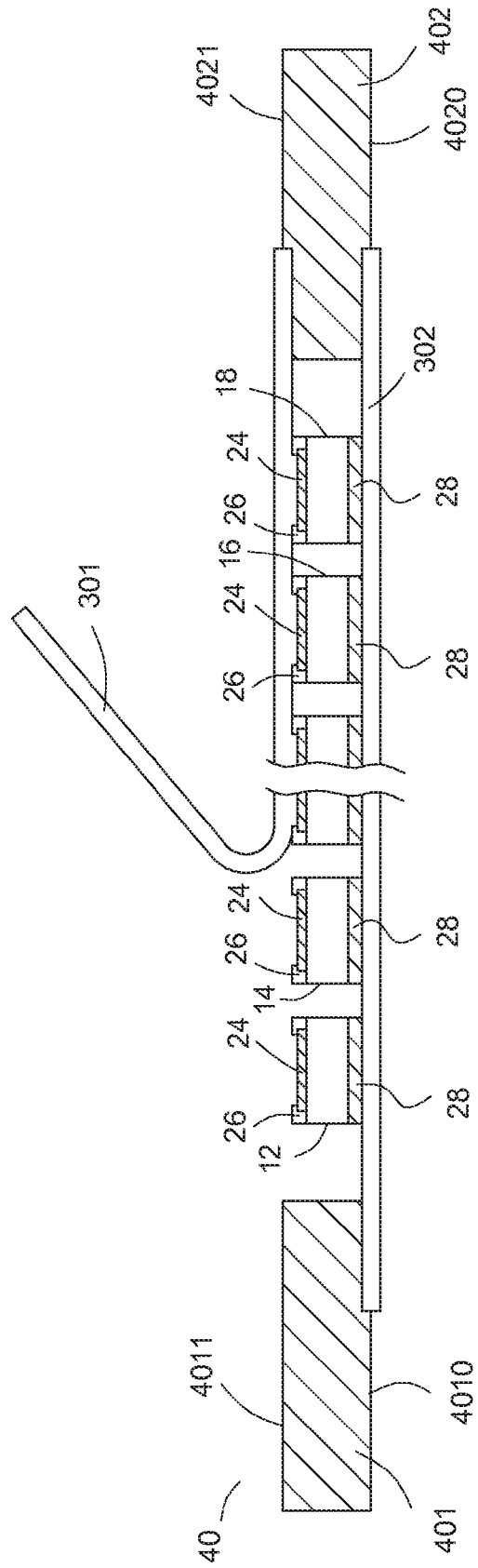

FIG. 15 illustrates a cross-sectional view of wafer 10 after further processing. In one embodiment, carrier tape 301 can be exposed to a UV light source to reduce the adhesiveness of the tape. Subsequently, carrier tape 302 can be applied or attached to layer 28 of wafer 10, surface 4010 of frame portion 401, and surface 4020 of frame portion 402. In accordance with the present embodiment, after carrier tape 302 is applied, carrier tape 301 can be removed from wafer 10 and frame 40 to expose conductive pads 24 overlying upper surface 21 of wafer 10. In a subsequent step, die 12, 14, 16, and 18 can be removed from carrier tape 302 using, for example, a pick-and-place apparatus 81 as generally illustrated in FIG. 11.

It is understood that carrier tape 30, 301, and/or 302 can be stretched or expanded during the fluid machining process to further assist in the removal of unwanted material from within the singulation lines. Also, apparatus 60 can include a megasonic apparatus to generate controlled acoustic cavitations in fluid 72. In addition, fluid 72 can be heated or cooled.

Figure 16:
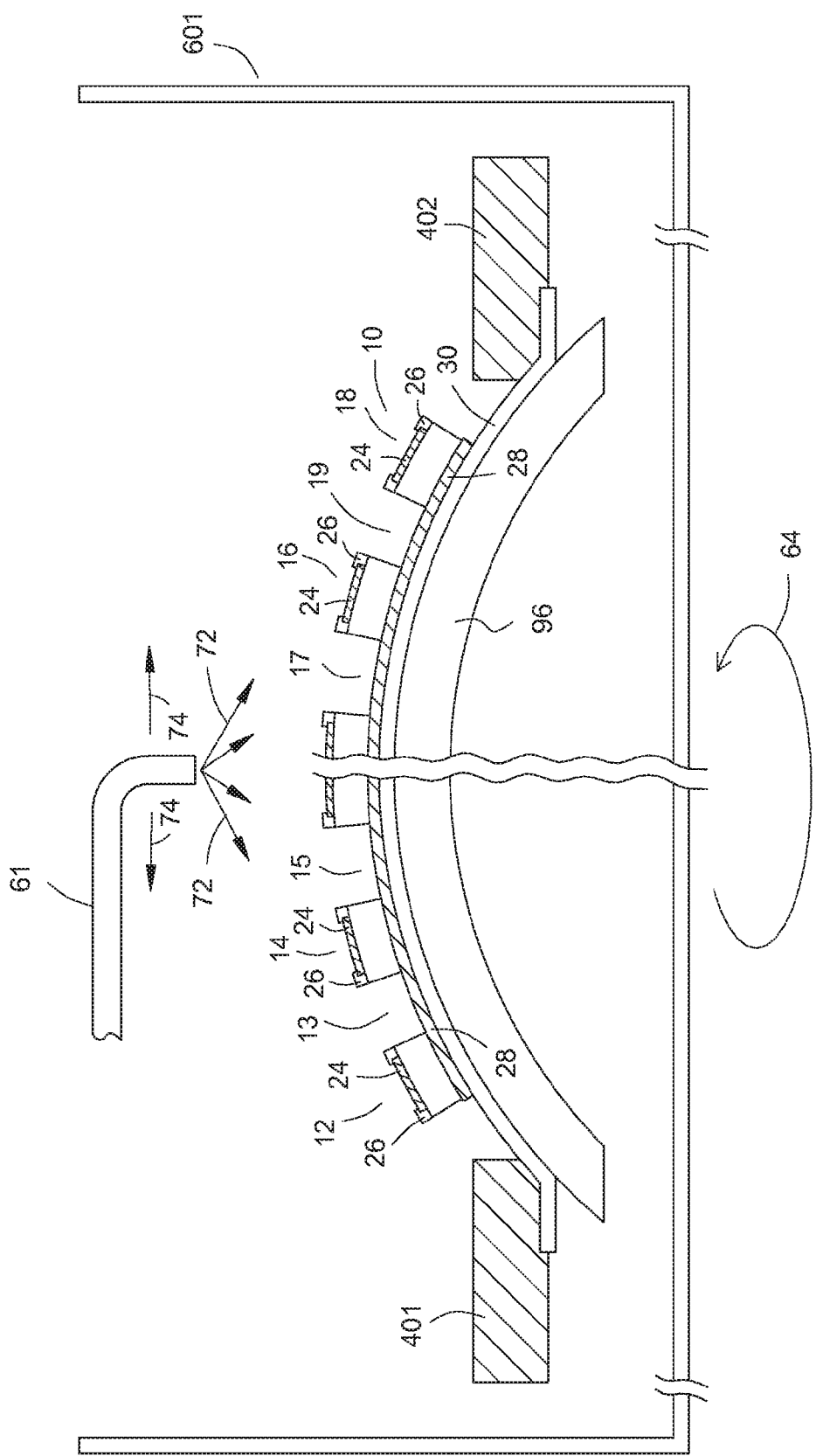
FIG. 16 illustrates a partial cross-sectional view of another embodiment of the present invention.

FIG. 16 illustrates a cross-section view of another embodiment. Wafer 10 on carrier substrate 10 can be placed in an apparatus 601, which can be similar to apparatus 60. In this embodiment, layer 28 can be a wafer backside coating (WBC) film, such as a die attach coating. In one embodiment, wafer 10 on carrier substrate 30 can be stretched to increase the distance between adjacent die. In one embodiment a work piece 96 can be used to stretch carrier substrate 30. Work piece 96 can be, for example, an arched bar or a domed structure. The stretching can enhance removal of layer 28 from singulation lines 13, 15, 17, and 19 using fluid 72. In one embodiment, wafer 10 can be cooled to a lower temperature to increase the brittleness of layer 28. In one embodiment, either fluid 72 or wafer 10 or both can be heated to enhance the removal of layer 28. In one embodiment, work piece 96 can move across wafer 10 when fluid 72 is flowing. In another embodiment, work piece 96 and wafer 10 can spin (as generally represented by arrow 64) when fluid 72 is flowing.

Figure 17:
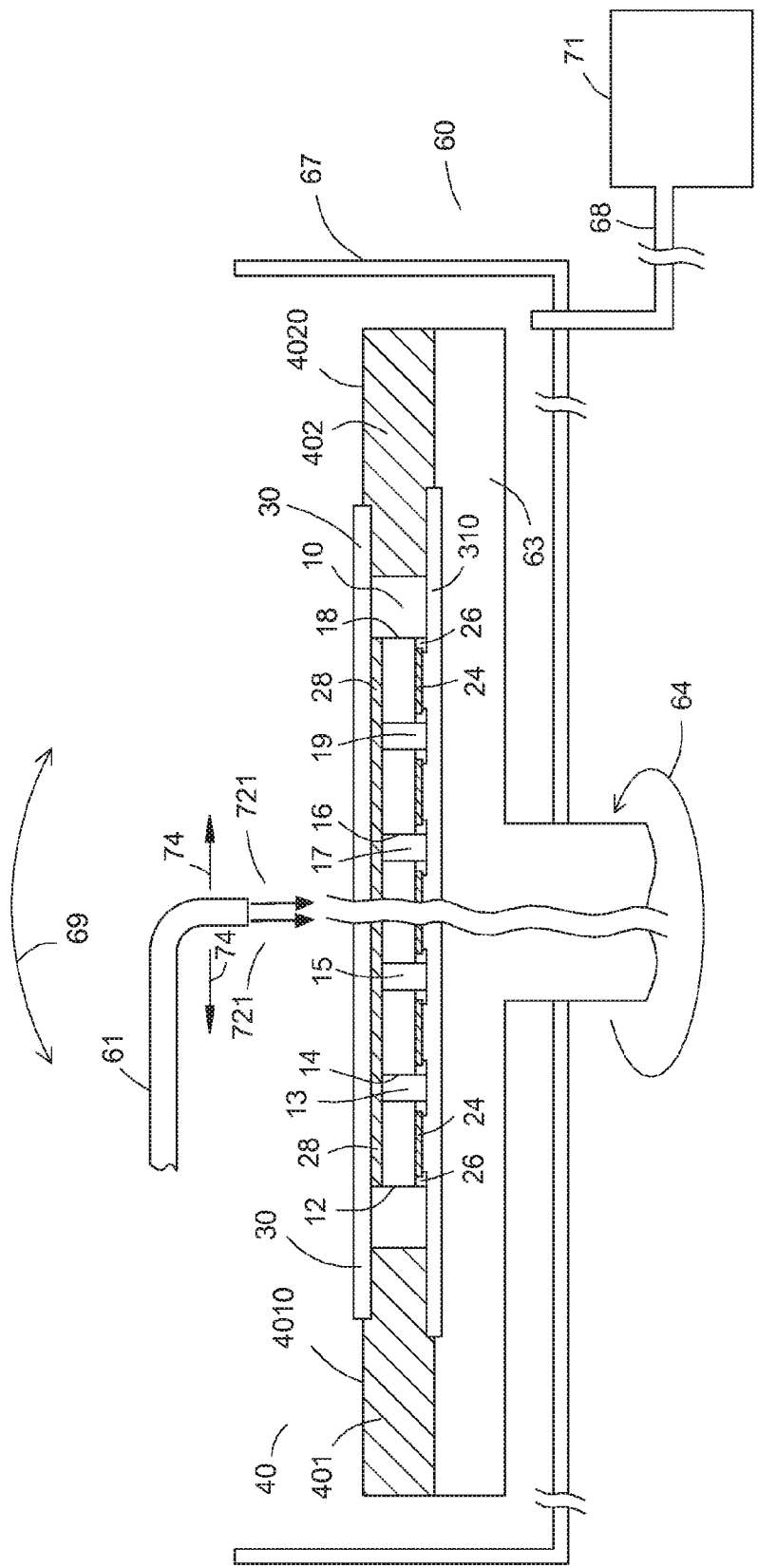
FIG. 17 illustrates a partial cross-section view of an embodiment of the semiconductor wafer of FIG. 1 at a subsequent stage of fabrication in accordance with a further embodiment of the present invention.

FIG. 17 illustrates a cross-section of a further embodiment. After wafer 10 is processed, for example, in accordance with FIGS. 2-4, a carrier or protective film 310 is provided to protect the front surface of wafer 10. In one embodiment, protective film 310 can be a carrier tape (such as carrier tape 301_described previously), a non-adhesive sheet, or other similar materials as known to those of skill in the art. In one embodiment, protective film 310 is configured to protect the front side of wafer 10 during subsequent processing. Wafer 10 is then placed within apparatus 60 with carrier tape 30 and layer 28 facing upward (towards nozzle 61), and portions of layer 28 can be separated from singulation lines 13, 15, 17, and 19 by using the fluid machining processes described previously but using carrier tape 30 as an intermediate or buffer layer to the pressured fluid. In one embodiment, fluid 721 is configured in a focused flow so that a smaller area of wafer 10 is contacted by fluid 721. In one embodiment, fluid 721 can be de-ionized water at a pressure from about 10,342 kPa to about 20,684 kPa (about 1500 psi to about 3000 psi) as measured at the fluid pump. Wafer 10 can be spinning at a rate from about 700 rpm to 1500 rpm with fluid 721 flowing onto wafer 10 from about 2 minutes to about 5 minutes. Also, the separation of layer 28 can be aided by ultrasonic waves or other high frequency techniques. Additionally, carrier tape 30 can be stretched during the fluid machining process. In addition, fluid 72 and/or carrier tape 30 can be heated or cooled. After separation, protective film 310 can be removed and die 12, 14, 16, and 189 can be removed from carrier tape 30 as part of a further assembly process using, for example, a pick-and-place apparatus 81 as generally illustrated in FIG. 11. In one embodiment, carrier tape 30 can be exposed to a UV light source prior to the pick-and-place step to reduce adhesiveness of the tape. In alternative embodiments, after the steps described in conjunction with FIG. 17, wafer 10 can be further processed in accordance with the steps described in conjunction with FIGS. 5, 8 and/or 14. In a further embodiment, work piece 96 (illustrated in FIG. 16) can be used to stretch carrier tape 30 and/or bend wafer 10 in a convex configuration to enhance removal of layer 28 from singulation lines 13, 15, 17, and 19 using fluid 721. In yet a further embodiment, a structure, such as a concave vacuum substrate, can be used to stretch carrier tape 30 and/or bend wafer 10 away from nozzle fixture 61 in a concave configuration.

In an alternative embodiment, one or more of the pump pressure applied to fluid jet 72 or 721, the speed in which nozzle 61 traverses across (e.g., back-and-forth, repetitive sweep, or single sweep) wafer 10, and/or the time in which fluid jet 72, 721 is dispensed against a selected zone within wafer 10 are varied to improve the results of the jet ablation process. More particularly, certain back layer 28 configurations require improved or enhanced process conditions in order to more effectively separate or remove back layer 28 from singulation lines 13, 15, 17, and 19. By way of example, thicker or stiffer backmetal schemes, such as titanium/nickel/silver, thicker gold (i.e., greater than about 1.0 micron), titanium/nickel/gold/tin, titanium/nickel/silver/tin, WBC layers, and similar schemes can require a stronger applied force (i.e., higher pump pressure) from fluid jet 72, 721 in order to remove, break and/or separate them from singulation lines 13, 15, 17, and 19. However, a stronger applied force from the fluid jet can cause some of the die to be lifted away from certain portions of wafer 10. In some embodiments, this tends be a center zone of wafer 10 while those portions of wafer 10 towards the peripheral edge segment may not be as sensitive to such lifting away issues. In accordance with the present embodiments, the speed of nozzle 61 is varied as a function of distance from the center of wafer 10. For example, faster speeds are used towards the center of wafer 10, and slower speeds are used towards outer portions of wafer 10. In another embodiment, the pressure of fluid jet 72, 721 is varied as a function of the distance from the center of wafer 10. In a further embodiment, wafer 10 is segregated into several zones, and the back layer processed in predetermined sequential manner.

Figure 18:
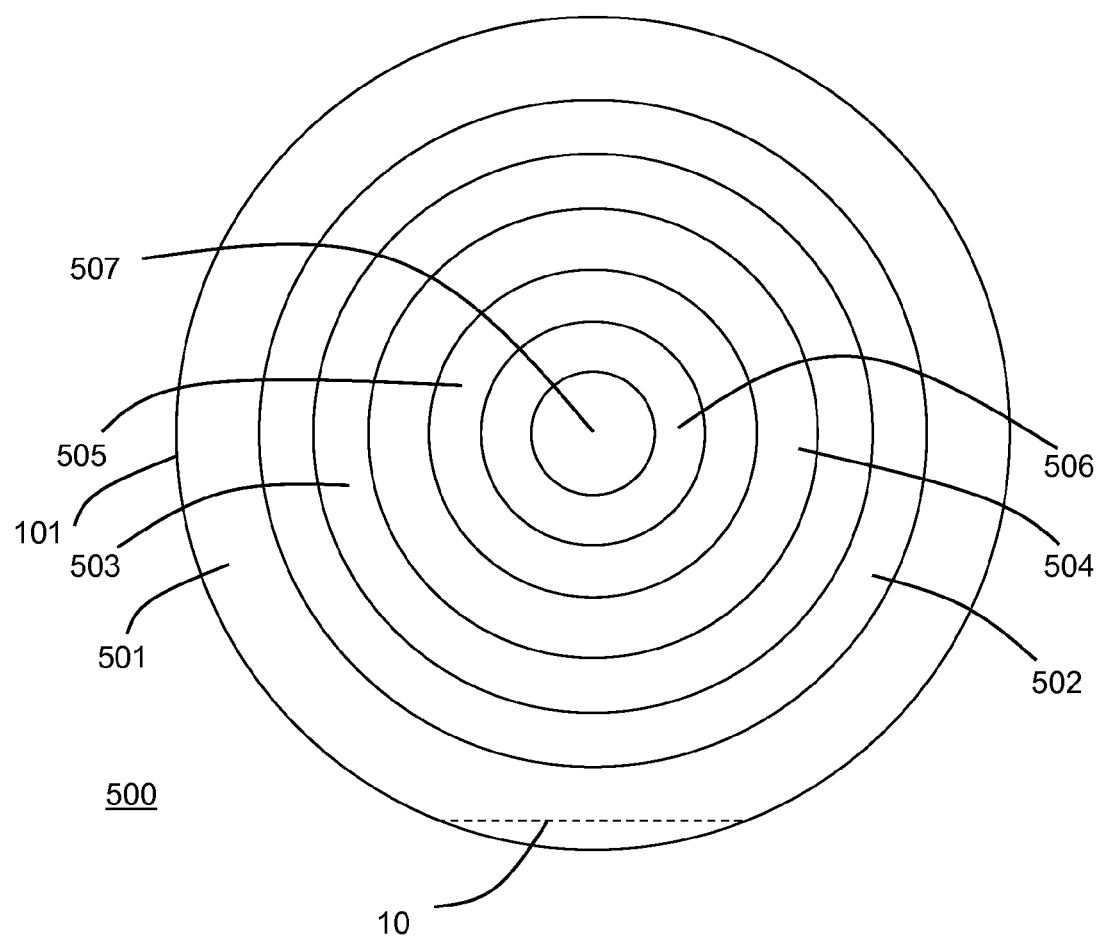
FIG. 18 illustrates a top plan view of a semiconductor wafer in accordance with embodiments of the present invention.

FIG. 18 illustrates a top view of wafer 10 segregated into a plurality of zones 500 or a plurality of regions 500 for purposes of illustrating the present embodiments. In accordance with the present embodiments, plurality of zones 500 is designated, established, or set with respect to back layer 28, and represents a processing pattern superimposed onto wafer 10 for purposes of carrying out a fluid jet ablation process for thicker back layers 28. The individual die, such as die 12, 14, 16, and 18, or singulation lines, such as singulation lines 13, 15, 17, and 19, are not illustrated in FIG. 18 to as to avoid overcrowding or confusing the illustration. In accordance with the present embodiments, plurality of zones 500 comprises at least two zones in which the jet ablation process parameters are adjusted to enhance the back layer separation process while maintaining the integrity of the adhesion between die 12, 14, 16 and 18 and carrier substrates 30, 301. In one embodiment, plurality of zones 500 comprises multiple concentric annular rings 501-506 of decreasing outer diameter and a center-most zone 507 comprising a generally circular shape. In one embodiment, the width of each concentric annular ring zone can be approximately the same. In other embodiments, the width of each concentric annular ring zone can vary. For example, in some embodiments, the width of the innermost ring zones (i.e., the ring zones adjacent to the center-most zone) can be smaller than the width of the outermost ring zones.

In accordance with one embodiment, the thicker back layer 28 is, the more zones plurality of zones 500 preferably includes. In some embodiments, for back layers 28 of up to about 2.0 microns, 2-3 zones can be used; for back layers between about 2.0 microns and about 3.0 microns, 3-4 zones can be used; for back layers between about 3.0 microns and 4.0 microns about 4-7 zones or more can be used. Also, smaller die sizes, narrower singulation lines, and thicker back layers generally require more zones than larger die sizes, wider singulation lines, and thinner back layers. Thus, in one embodiment, a wafer 10 having a thick back layer 28, with very small die, and with very narrow singulation lines can have more zones than a wafer 10 having a thick back layer 28 and larger die and/or wider singulation lines. Although FIG. 18 illustrates seven zones 501-507, this is for illustrative purposes and more or less zones may be used with at least two or more zones preferred for back layers thicker than 1.0 micron, with at least a center zone 507 being one of the zones for all embodiments.

In accordance with the present embodiments, the fluid jet process parameters are varied depending upon which zones (e.g., zones 501-507) of plurality of zones 500 nozzle 61 is dispensing fluid jet 72, 721 within. In one embodiment, wafer 10 is spinning while nozzle 61 is moving and emitting or dispensing fluid jet 72, 721. In a first embodiment, the boom arm that includes nozzle 61 can be programmed to start its sweep oscillations a predetermined distance outward from the center of wafer 10. From that distance nozzle 61 sweeps towards an outer edge 101 of wafer 10 to provide an annular or two dimensional torus shape process or removal pattern. During the beginning of this process the inner most zones including center zone 507 are untouched by fluid jet 72, 721. In a subsequent step, the sweep of nozzle 61 moves inward to process an inner zone closer towards the center of wafer 10 and then back towards outer edge 101. This process is repeated until center zone 507 is processed towards the end of the process recipe. By way of example, nozzle 61 can start in zone 501 and sweep outward towards outer edge 101 and then back across zone 501. This cycle can be repeated one or more times and then nozzle 61 can be programmed, for example, to move from 101 outer edge of wafer 10 further inward across zones 501 and 502 and then back across zones 502 and 501 to outer edge 101. This method can be repeated to progressively span across more inner zones to outer zones until center zone 507 is reached at which time nozzle 61 can sweep back and forth across all zones. Such a process can be referred to as a progressively increasing nozzle sweep pattern where the process variables are adjusted as the sweep distance increases towards the inner zones and particularly center zone 507. It is understood that a programmed sweep length can repeat or oscillate back and forth for a predetermined time at a specified length or distance before it is adjusted to a new length or distance.

In another embodiment, this process can be reversed or can be carried in a reverse order. More particularly, the first sweep of nozzle 61 can span from outer edge 101 of wafer 10 across all zones to center zone 507 and then back to outer edge 101, and then in a subsequent sweep can get progressively shorter. For example, subsequent sweeps can span zones 501 to 506 and then back to outer edge 101; then span zones 501 to 505 and back to outer edge 101; and continuing to progressively step down the sweep length. Such a process can be referred to as a progressively decreasing nozzle sweep pattern where the process variables are adjusted as the sweep distance decreases towards the outer zones. It is understood that a programmed sweep length can repeat or oscillate back and forth for a predetermined time at a specified length or distance before it is adjusted to a new length or distance.

In yet another embodiment, nozzle 61 is programmed to sweep back-and-forth within a selected zone and then can be shifted to a next zone where the process parameters can be adjusted depending upon which zone is being exposed to fluid jet 72, 721. For example, nozzle 61 can be programmed to sweep back and forth within center zone 507, and then move to zone 506 to sweep back and forth within zone 506, progressively moving from zone to zone until finishing in zone 501. This process can be done in the opposite direction as well starting in outer zone 501 and then progressively stepping to the inner zones and finishing with center zone 507. Such a process can be referred to as a zone-specific sweep pattern. It is further understood that the programmed sweep pattern of nozzle 61 can comprise a combination of the patterns described herein as well as variations thereof. It is also understood that different process variables can be adjusted within different zones. That is, the fluid jet process parameters are adjusted or varied depending on which zone or zones nozzle 61 is located within. It is further understood that nozzle 61 can dispense fluid jet 72, 721 directly onto wafer 10 or indirectly through carrier substrate 30.

In one embodiment, process parameters, such as wafer spin speed, fluid jet applied pressure (as set for example, at the pressure set or established at the fluid pump or similar apparatus), and the speed at which nozzle 61 traverses across wafer 10 can be varied depending on which zones nozzle 61 is currently dispensing fluid jet 72, 721 onto or within. In accordance with the present embodiments and in general, the speed at which nozzle 61 swings or sweeps across wafer 10 preferably is faster when, for example, zone 507 or zones 506, 507 are exposed to fluid jet 72, 721. Also, a slower swing speed is preferred in some embodiments when nozzle 61 enters the outer zones, such as zone 501, zones 501,502, or zones 501, 502, 503. Additionally, the time period that nozzle 61 is dispensing fluid jet 72, 721 within zone 507 (or zones 506 and 507) is preferably shorter than the time period nozzle 61 is dispensing fluid jet 72, 721 in the outer zones (e.g., zones 501, 501-502, or 501-503). Further, the speed that wafer 10 rotates can be increased when nozzle 61 is within center zones (e.g., zone 507 or 506-507) of wafer 10 and decreased when nozzle 61 is within the outer zones (e.g., zones 501, 501-502, or 501-503). Moreover, in some embodiments nozzle 61 has fan-out angle between 20 degrees and 30 degrees with 25 degrees being preferred.

An example process will now be described for a 3.0 micron back layer 28 comprising a composite conductive layer, such as titanium/nickel/gold/tin. In this example plurality zones 500 comprises six zones 507, 506, 505, 504, 503, and 502 where 502 is the outermost zone and 507 is the center zone. In one embodiment, nozzle 61 is programmed to start at the inner edge of zone 502 and oscillates back and forth within zone 502 (which can include outer edge 101 of wafer 10 as the outer edge) at about an angular velocity of about 1 degree/sec for a time period of about 160 seconds to about 220 seconds, with wafer 10 spinning at a wafer speed of about 475 rpm to about 550 rpm, and fluid jet 72, 721 under a pump pressure from about 7 Mega-Pascal (MPa) to about 9 MPa. Next, nozzle 61 sweeps zones 502 and 503 for time period of about 140 seconds to about 170 seconds at a similar wafer spin speed and angular velocity with the pump pressure decreased by about 0.25 MPa to about 0.6 MPa. Next, nozzle 61 sweeps zones 502, 503, and 504 for a time period of about 140 seconds to about 170 seconds at a similar wafer spin speed and angular velocity but with the pump pressure decreased by about 0.1 MPa to about 0.4 MPa. Next, nozzle 61 sweeps zones 502, 503, 504, and 505 for a time period of about 40 seconds to about 70 seconds at a wafer spin speed of about 980 rpm to about 1100 rpm, an angular velocity of about 10 degrees/second, and with the pump pressure decreased by about 0.2 MPa to about 0.5 MPa. Next, nozzle 61 sweeps zones 502, 503, 504, 505 and 506 for a time period of about 40 seconds to about 70 seconds at a similar wafer spin speed of and angular velocity but with the pump pressure decreased by about 0.8 MPa to about 1.0 MPa. Finally, nozzle 61 sweeps zones 502, 503, 504, 505, 506 and 507 for a time period of about 150 seconds to about 190 seconds at a similar wafer spin speed of and angular velocity but with the pump pressure decreased by about 0.8 MPa to about 1.6 MPa.

In one embodiment, the pump pressure towards the end of the fluid jet ablation process is approximately 37% to approximately 48% lower than the pump pressure towards the start of the fluid jet ablation process. In another embodiment, the pump pressure towards the end of the fluid jet ablation process is approximately 37% to approximately 93% lower than the pump pressure towards the start of the fluid jet ablation process or in comparison to the outer zones. In a further embodiment, the wafer spin speed towards the end of the fluid jet ablation process is approximately 1.5 to 2.25 times the wafer spin speed towards the start of the fluid jet ablation process. In a still further embodiment, the swing speed of nozzle 61 towards the end of the fluid jet ablation process is approximately 10× the swing speed of nozzle 61 towards the start of the fluid ablation process. In yet another embodiment, the pump pressure is reduced by about 2% to about 8% in successive outer zones and then reduced by about 15% to about 25% as more inner zones and the center zone are processed. In other words, the pump pressure is reduced in a non-linear manner as more inner zones are added to the sweep pattern of nozzle 61.

Figure 19:
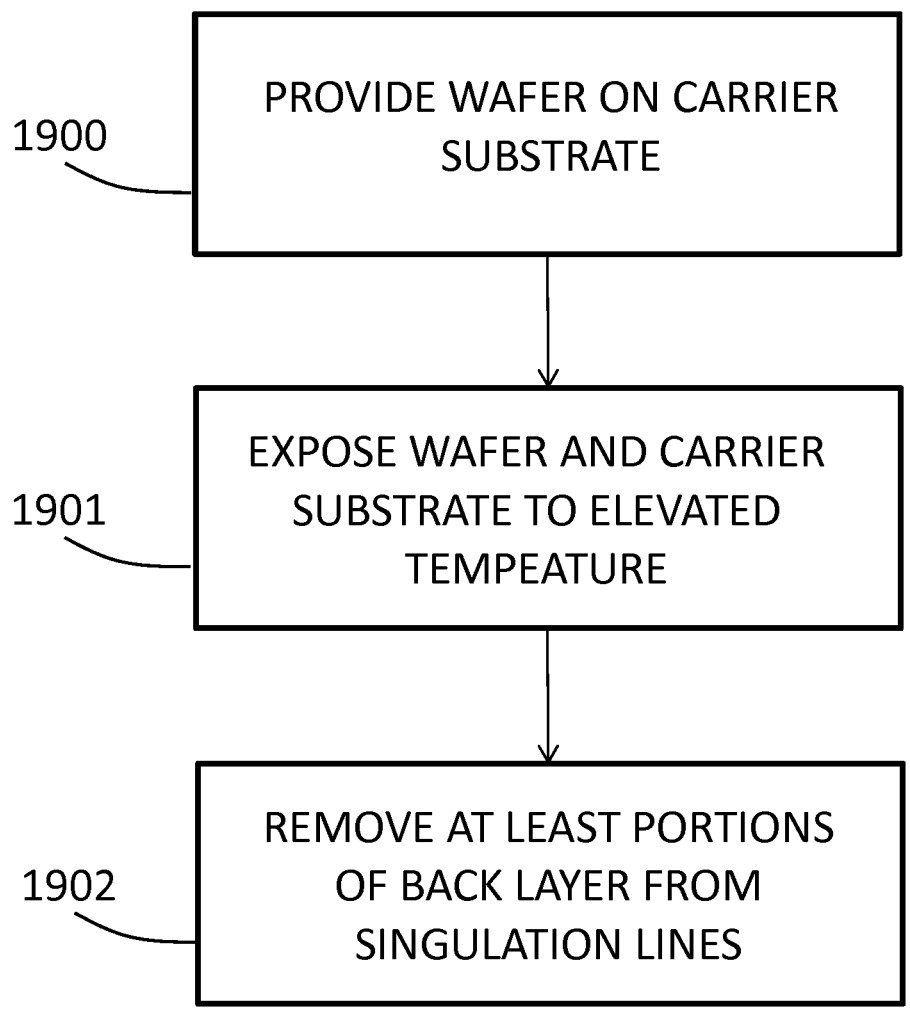
FIG. 19 shows a flow chart illustrating a back layer separation process in accordance with another embodiment of the present invention.

FIG. 19 shows a flowchart illustrating a method for removing back layer 28 from singulation lines 13, 15, 17, and 19 in accordance with a further embodiment. In certain embodiments, the characteristics of the adhesion between wafer 10 including semiconductor die 12, 14, 16, and 18 can further impact whether or not semiconductor die 12, 14, 16, and 18 remain on carrier substrate 30, 301 during the fluid jet ablation process. Variations in adhesion are observed within a wafer and from wafer-to-wafer. The adhesion of the die to the carrier substrate is dependent upon several factors, including, but not limited to the type of adhesion used, the surface of the die (i.e., surface area, texture, etc.), and the length of time the die is in contact with the carrier substrate. For example, the longer the die is in contact with the carrier substrate, generally the higher the adhesion. However, waiting an excessive period of time for the adhesion to increase is not practical for large scale manufacturing. Also, using a higher adhesive carrier substrate is not always a reliable solution because higher adhesive carrier substrates can cause other problems including, but not limited to, back layer delamination or pick and place malfunctions. Thus, a need exists to eliminate the frequency of having die lose adhesion to carrier substrates during the fluid jet ablation process. Also, a need exists to widen the process window during the fluid jet ablation process by having a more consistent and enhanced adhesion between the die and the carrier substrate that is consistent across a wafer and wafer to wafer.

In accordance with one embodiment, in a step 1900 a wafer, such as semiconductor wafer 10 is provided on a carrier substrate, such as carrier substrate 30 or carrier substrate 301 as described previously. In a step 1901, semiconductor wafer 10 and carrier substrate 30, 301 are subjected to an elevated temperature to cure carrier substrate 30, 301 thereby improving the adhesion between semiconductor wafer 10 and carrier substrate 30, 301. By improving, it is contemplated that adhesion can be increased and/or variability of adhesion across semiconductor wafer 10 and/or from wafer-to-wafer is reduced. In one embodiment, semiconductor wafer 10 and carrier substrate 30, 301 are placed in an oven having an inert ambient at a temperature above approximately 45 degrees Celsius for a time period of at least 15 minutes. In other embodiments, the oven can be placed under vacuum when back layer 28 has a rough surface or high topography. In one embodiment, semiconductor wafer 10 on carrier substrate 30, 301 are placed in an oven having an environment comprising nitrogen at a temperature between approximately 73 degrees Celsius and approximately 96 degrees Celsius for approximately 70 minutes to approximate 105 minutes. This process can be done in several wafers (i.e., batch process) or with a single wafer. In step 1903, at least portions of back layer 28 are removed from singulation lines 13, 15, 17, and 19 using, for example, a fluid or fluid jet ablation process.

In one embodiment, the forgoing cure process can be particularly beneficial when the fluid jet ablation process is to occur in a short time period after the carrier substrate is placed onto semiconductor wafer 10. In some embodiments, the foregoing cure process can be used in conjunction with the varied fluid jet process parameters described previously. In other embodiments, the cure process can be used instead of the varied fluid jet process parameters described previously.

From all of the foregoing, one skilled in the art can determine that, according to one embodiment, a method of singulating semiconductor die from a semiconductor wafer (for example, element 10) comprises providing a semiconductor wafer having a plurality of semiconductor die (for example, elements 12, 14, 16, 18) formed on the semiconductor wafer and separated from each other by spaces, wherein the semiconductor layer has first and second opposing major surfaces (for example, elements 21, 22), and wherein a layer of material (for example, element 28) is formed along the second major surface. The method includes placing the semiconductor wafer onto a first carrier substrate (for example, element 30), wherein the layer of material is adjacent the first carrier substrate and singulating the semiconductor wafer through the spaces to form singulation lines (for example, elements 13, 15, 17, 19), wherein singulating includes stopping in proximity to the layer of material. The method includes separating portions of the layer of material proximate to the singulation lines using a fluid jet (for example, element 72, 721) emitted from a nozzle (for example, element 61) at an applied pressure, wherein separating comprises: designating a plurality of zones (for example, element 500) of the layer of material to be separated, the plurality of zones comprising a center zone (for example, element 507) corresponding to a substantially central portion of the semiconductor wafer and at least one outer zone surrounding the central zone (for example, element 501, 502, 503, 504, 505, 506); spinning the semiconductor wafer at a selected wafer spin speed; moving the nozzle with respect to the semiconductor wafer at a selected sweep speed; and adjusting at least the applied pressure depending upon which of the plurality zones is exposed to the fluid jet, wherein adjusting comprises reducing the applied pressure in the center zone.

From all of the foregoing, one skilled in the art can determine that, according to another embodiment, adjusting can comprise adjusting the wafer spin speed, wherein the wafer spin speed is increased in the center zone. In a further embodiment, adjusting comprises adjusting the sweep speed, wherein the sweep speed can be increased in the center zone. In a still further embodiment, adjusting can comprise adjusting the sweep speed, wherein the sweep speed is increased in the center zone; and adjusting comprises reducing the applied pressure by about 37% to about 93% in the center zone compared to the first outer zone. In another embodiment, adjusting can comprise reducing the applied pressure by about 37% to about 48%. In a further embodiment, separating portions of the layer of material can comprise separating the at least one outer zone before separating the center zone. In a still further embodiment, designating comprises designating at least three zones comprising concentric annular rings of decreasing outer diameter. In another embodiment, separating can comprise separating an outermost zone before separating a zone between the outermost zone and the center zone. In another embodiment, designating can comprise designating a number of zones dependent upon thickness of the layer of material. In a further embodiment, separating can comprise separating with a nozzle having a fan-out angle between about 20 degrees and about 30 degrees. In still further embodiment, separating portions of the layer of material can comprise the steps of: attaching a second carrier substrate (for example, element 301) to the first major surface of the semiconductor wafer; removing the first carrier substrate; exposing the semiconductor wafer and the second carrier substrate to an elevated temperature (for example, element 1901); and separating the portions of the layer of material from the singulation lines using the fluid jet. In another embodiment, providing the semiconductor wafer can comprise providing the semiconductor wafer having a conductive layer overlying the second major surface; placing the semiconductor wafer onto the first carrier substrate can comprise placing the semiconductor wafer onto a carrier tape; singulating the semiconductor wafer can comprise plasma etching the semiconductor wafer; and the method further comprises exposing the semiconductor wafer and the carrier tape to an elevated temperature before separating.

From all of the foregoing, one skilled in the art can determine that, according to a further embodiment, the foregoing method can further comprise placing a protective film (for example, element 310) adjacent the first major surface.

From all of the foregoing, one skilled in the art can determine that according to a another embodiment, a method of singulating a substrate comprises providing a substrate (for example, element 10) having a plurality of die (for example, element 12, 14, 16, 18) formed on the substrate and separated from each other by singulation lines (for example, element 13 15 17 19), wherein the substrate has first and second opposing major surfaces (for example, elements 21, 22), and wherein a layer of material (for example, element 28) is formed overlying the second major surface, and wherein the singulation lines terminate in proximity to the layer of material. The method includes separating portions of the layer of material from the singulation lines using a fluid jet (for example, element 72, 721), wherein separating comprises: segregating the layer of material into a plurality of zones to be separated, the plurality of zones (for example, element 500) comprising a center zone (for example, element 507) corresponding to a substantially central portion of the substrate and at least one outer zone surrounding the central zone; and adjusting applied pressure of the fluid jet depending upon which of the plurality zones is exposed to the fluid jet, wherein adjusting comprises reducing the applied pressure in the center zone.

From all of the foregoing, one skilled in the art can determine that according to further embodiment, in the foregoing method, separating can further comprise: spinning the substrate at a selected wafer spin speed, wherein the wafer spin speed is increased in the center zone; moving the nozzle with respect to the substrate at a selected sweep speed, wherein the sweep speed is increased in the center zone; and the method can further comprise exposing the substrate and the carrier substrate to an elevated temperature before separating. In another embodiment, providing the substrate can comprise providing a semiconductor wafer having a conductive layer formed overlying the second major surface; and segregating comprises designating a number of zones dependent upon thickness of the conductive layer with the number of zones increasing with increasing thickness.

From all of the foregoing, one skilled in the art can determine that according to another embodiment, a method of singulating electronic die from a wafer comprises providing the wafer (for example, element 10) having a plurality of electronic die (for example, elements 12, 14, 16, 18) formed as part of the wafer and separated from each other by spaces defining where singulation lines (for example, elements 13, 15, 17, 19) will be formed, wherein the wafer has first and second opposing major surfaces (for example, elements 21, 22), and wherein a layer of material (for example, element 28) is formed overlying the second major surface. The method includes placing a first carrier tape (for example, element 30) onto the layer of material. The method includes plasma etching the wafer through the spaces to form the singulation lines, wherein the singulation lines terminate in proximity to the layer of material. The method includes removing portions of the layer of material within the singulation lines using a fluid jet, (for example, element 72, 721) wherein removing comprises: separating the layer of material into a plurality of zones of the layer of material to be processed, the plurality of zones (for example, element 500) comprising a center zone (for example, element 507) corresponding to a substantially central portion of the wafer and at least one outer zone surrounding the central zone; spinning the wafer at a selected wafer spin speed; moving the nozzle with respect to the wafer at a selected sweep speed; and adjusting at least the applied pressure depending upon which of the plurality zones is exposed to the fluid jet, wherein adjusting comprises reducing the applied pressure in the center zone.

In another embodiment, adjusting can comprise adjusting the wafer spin speed, wherein the wafer spin speed is increased in the center zone; and adjusting the sweep speed, wherein the sweep speed is increased in the center zone. In a further embodiment, separating comprises separating the layer of material into the plurality of zones comprising a first outer zone between an outer edge of the wafer and the center zone and second outer zone between the first outer zone the center zone, and adjusting can comprise reducing the applied pressure by about 37% to about 93% in the center zone compared to the first outer zone. In a still further embodiment, removing portions of the layer of material comprises attaching a second carrier substrate (for example, element 301) to the first major surface of the semiconductor wafer; removing the first carrier substrate; exposing the second carrier substrate and the semiconductor wafer to an elevated temperature (for example, element 1901); and separating the portions of the layer of material from the singulation lines using the fluid jet. In another embodiment, separating can comprise setting a number of zones dependent upon thickness of the layer of material; and removing can comprise using a nozzle having a fan-out angle between about 20 degrees and about 30 degrees.

From all of the foregoing, one skilled in the art can determine that according to another embodiment, a method of singulating semiconductor die from a semiconductor wafer comprises providing a semiconductor wafer (for example, element 10) having a plurality of semiconductor die (for example, element 12, 14, 16, 18) formed on the semiconductor wafer and separated from each other by spaces, wherein the semiconductor layer has first and second opposing major surfaces (for example, element 21, 22), and wherein a layer of material (for example, element 28) is formed along the second major surface. The method includes placing the semiconductor wafer onto a first carrier substrate (for example, element 30), wherein the layer of material is adjacent the first carrier substrate and singulating the semiconductor wafer through the spaces to form singulation lines (for example, element 13, 15, 17, 19), wherein singulating includes stopping in proximity to the layer of material. The method includes attaching a second carrier substrate (for example, element 301) to the first major surface of the semiconductor wafer and exposing the second carrier substrate and the semiconductor wafer to an elevated temperature (for example, element 1901). The method includes separating portions of the layer of material proximate to the singulation lines using a fluid jet (for example, 72, 721) emitted from a nozzle.

In another embodiment, the method can further comprise removing the first carrier substrate before separating portions of the layer of material. In a further embodiment, providing the semiconductor wafer comprises providing a layer of material comprising a conductive material and separating comprises placing the semiconductor wafer adjacent the nozzle. In a still further embodiment, the fluid jet is emitted from a nozzle at an applied pressure, and wherein separating and comprise designating a plurality of zones of the layer of material to be separated, the plurality of zones comprising a center zone corresponding to a substantially central portion of the semiconductor wafer and at least one outer zone surrounding the central zone; spinning the semiconductor wafer at a selected wafer spin speed; moving the nozzle with respect to the semiconductor wafer at a selected sweep speed; and adjusting at least the applied pressure depending upon which of the plurality zones is exposed to the fluid jet, wherein adjusting comprises reducing the applied pressure in the center zone.

In view of all of the above, it is evident that a novel method is disclosed. Included, among other features, is placing a substrate having a layer of material on a major surface of the substrate onto a carrier tape, and forming singulation lines through the substrate to expose portions of the layer of material within the singulation lines. A fluid machining process is then used to remove the exposed portions of the layer of material while the substrate is on a carrier tape. In one embodiment, the fluid machining process parameters are modified depending on which portions of the substrate are being processed. In another embodiment, the carrier substrate and the substrate are cured at an elevated temperature to improve adhesion and/or reduce adhesion variability. The method provides, among other things, an efficient, reliable, and cost effective process for singulating substrates that include back layers, such as backmetal layers or WBC layers.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other forms of removable support materials can be used instead of carrier tapes.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method of singulating semiconductor die from a semiconductor wafer comprising:
providing a semiconductor wafer having a plurality of semiconductor die formed on the semiconductor wafer and separated from each other by spaces, wherein the semiconductor wafer has first and second opposing major surfaces, and wherein a layer of material is formed along the second major surface;
placing the semiconductor wafer onto a first carrier substrate, wherein the layer of material is adjacent the first carrier substrate;
singulating the semiconductor wafer through the spaces to form singulation lines, wherein singulating includes stopping in proximity to the layer of material; and
separating portions of the layer of material proximate to the singulation lines using a fluid jet emitted from a nozzle at an applied pressure, wherein separating comprises:
designating a plurality of zones of the layer of material to be separated, the plurality of zones comprising a center zone corresponding to a substantially central portion of the semiconductor wafer and at least one outer zone surrounding the center zone;
spinning the semiconductor wafer at a selected wafer spin speed;
moving the nozzle with respect to the semiconductor wafer at a selected sweep speed; and
adjusting at least the applied pressure depending upon which of the plurality zones is exposed to the fluid jet, wherein adjusting comprises reducing the applied pressure in the center zone.

2. The method of claim 1, wherein adjusting comprises adjusting the wafer spin speed, wherein the wafer spin speed is increased in the center zone.

3. The method of claim 2, wherein adjusting comprises adjusting the sweep speed, wherein the sweep speed is increased in the center zone.

4. The method of claim 1, wherein:
designating comprises designating the plurality of zones comprising a first outer zone between an outer edge of the semiconductor wafer and the center zone and a second outer zone between the first outer zone and the center zone; and
adjusting comprises reducing the applied pressure by about 37% to about 93% in the center zone compared to the first outer zone.

5. The method of claim 4, wherein adjusting comprises reducing the applied pressure by about 37% to about 48%.

6. The method of claim 1, wherein separating portions of the layer of material comprises separating the at least one outer zone before separating the center zone.

7. The method of claim 1, wherein designating comprises designating at least three zones comprising concentric annular rings of decreasing outer diameter.

8. The method of claim 7, wherein separating comprises separating an outermost zone before separating a zone between the outermost zone and the center zone.

9. The method of claim 1, wherein designating comprising designating a number of zones dependent upon thickness of the layer of material.

10. The method of claim 1, wherein separating comprises separating with a nozzle having a fan-out angle between about 20 degrees and about 30 degrees.

11. The method of claim 1, wherein separating portions of the layer of material comprises the steps of:
attaching a second carrier substrate to the first major surface of the semiconductor wafer;
removing the first carrier substrate;
exposing the semiconductor wafer and the second carrier substrate to an elevated temperature; and
separating the portions of the layer of material from the singulation lines using the fluid jet.

12. The method of claim 1, wherein:
providing the semiconductor wafer comprises providing the semiconductor wafer having a conductive layer overlying the second major surface;
placing the semiconductor wafer onto the first carrier substrate comprises placing the semiconductor wafer onto a carrier tape;
singulating the semiconductor wafer comprises plasma etching the semiconductor wafer; and
the method further comprises exposing the semiconductor wafer and the carrier tape to an elevated temperature before separating.

13. A method of singulating a substrate comprising:
providing a substrate having a plurality of die formed on the substrate and separated from each other by singulation lines, wherein the substrate has first and second opposing major surfaces, and wherein a layer of material is formed overlying the second major surface, and wherein the singulation lines terminate in proximity to the layer of material, and wherein the substrate is attached to a carrier substrate; and
separating portions of the layer of material from the singulation lines using a fluid jet, wherein separating comprises:
segregating the layer of material into a plurality of zones to be separated, the plurality of zones comprising a center zone corresponding to a substantially center portion of the substrate and at least one outer zone surrounding the center zone; and
adjusting applied pressure of the fluid jet depending upon which of the plurality zones is exposed to the fluid jet, wherein adjusting comprises reducing the applied pressure in the center zone.

14. The method of claim 13, wherein: separating further comprises:
spinning the substrate at a selected wafer spin speed, wherein the wafer spin speed is increased in the center zone; and
moving the nozzle with respect to the substrate at a selected sweep speed, wherein the sweep speed is increased in the center zone; and
the method further comprises exposing the substrate and the carrier substrate to an elevated temperature before separating.

15. The method of claim 13, wherein:
providing the substrate comprises providing a semiconductor wafer having a conductive layer formed overlying the second major surface; and
segregating comprises designating a number of zones dependent upon thickness of the conductive layer with the number of zones increasing with increasing thickness.

16. A method of singulating electronic die from a wafer comprising:
providing the wafer having a plurality of electronic die formed as part of the wafer and separated from each other by spaces defining where singulation lines will be formed, wherein the wafer has first and second opposing major surfaces, and wherein a layer of material is formed overlying the second major surface;
placing a first carrier substrate onto the layer of material;

plasma singulating the wafer through the spaces to form the singulation lines, wherein the singulation lines terminate in proximity to the layer of material; and removing portions of the layer of material within the singulation lines using a fluid jet, wherein removing comprises:
  separating the layer of material into a plurality of zones of the layer of material to be processed, the plurality of zones comprising a center zone corresponding to a substantially central portion of the wafer and at least one outer zone surrounding the center zone;
  spinning the wafer at a selected wafer spin speed;
  moving the nozzle with respect to the wafer at a selected sweep speed; and
  adjusting at least an applied pressure depending upon which of the plurality zones is exposed to the fluid jet, wherein adjusting comprises reducing the applied pressure in the center zone.

17. The method of claim 16, wherein adjusting comprises:
  adjusting the wafer spin speed, wherein the wafer spin speed is increased in the center zone; and
  adjusting the sweep speed, wherein the sweep speed is increased in the center zone.

18. The method of claim 16, wherein:
  separating comprises separating the layer of material into the plurality of zones comprising a first outer zone between an outer edge of the wafer and the center zone and a second outer zone between the first outer zone and the center zone; and
  adjusting comprises reducing the applied pressure by about 37% to about 93% in the center zone compared to the first outer zone.

19. The method of claim 16, wherein removing portions of the layer of material comprises:
  attaching a second carrier substrate to the first major surface of to avoid lack of antecedent basis;
  removing the first carrier substrate;
  exposing the second carrier substrate and the wafer to an elevated temperature; and
  separating the portions of the layer of material from the singulation lines using the fluid jet.

20. The method of claim 16, wherein:
  separating comprises setting a number of zones dependent upon thickness of the layer of material; and
  removing comprises using a nozzle having a fan-out angle between about 20 degrees and about 30 degrees.

21. A method of singulating semiconductor die from a semiconductor wafer comprising:
  providing a semiconductor wafer having a plurality of semiconductor die formed on the semiconductor wafer and separated from each other by spaces, wherein the semiconductor wafer has first and second opposing major surfaces, and wherein a layer of material is formed along the second major surface;
  placing the semiconductor wafer onto a first carrier substrate, wherein the layer of material is adjacent the first carrier substrate;
  singulating the semiconductor wafer through the spaces to form singulation lines, wherein singulating includes stopping in proximity to the layer of material;
  attaching a second carrier substrate to the first major surface of the semiconductor wafer;
  exposing the second carrier substrate and the semiconductor wafer to an elevated temperature; and
  separating portions of the layer of material proximate to the singulation lines using a fluid jet emitted from a nozzle.

22. The method of claim 21 further comprising removing the first carrier substrate before separating portions of the layer of material.

23. The method of claim 21, wherein:
  providing the semiconductor wafer comprises providing a layer of material comprising a conductive material; and
  separating comprises placing the semiconductor wafer adjacent the nozzle.

24. The method of claim 21, wherein the fluid jet is emitted from a nozzle at an applied pressure, and wherein separating comprises:
  designating a plurality of zones of the layer of material to be separated, the plurality of zones comprising a center zone corresponding to a substantially central portion of the semiconductor wafer and at least one outer zone surrounding the center zone;
  spinning the semiconductor wafer at a selected wafer spin speed;
  moving the nozzle with respect to the semiconductor wafer at a selected sweep speed; and
  adjusting at least the applied pressure depending upon which of the plurality zones is exposed to the fluid jet, wherein adjusting comprises reducing the applied pressure in the center zone.

* * * * *